(12) United States Patent
Wang

(10) Patent No.: US 8,841,955 B1
(45) Date of Patent: Sep. 23, 2014

(54) VOLTAGE LEVEL SHIFTER

(71) Applicant: Raydium Semiconductor Corporation, Hsinchu (TW)

(72) Inventor: Yi-Ting Wang, Pingtung County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 13/946,815

(22) Filed: Jul. 19, 2013

(30) Foreign Application Priority Data

Mar. 13, 2013 (TW) .............................. 102108884 U

(51) Int. Cl.
*H03L 5/00* (2006.01)
(52) U.S. Cl.
CPC ........................................ *H03L 5/00* (2013.01)
USPC .......................................................... 327/333
(58) Field of Classification Search
USPC .......................................................... 327/333
See application file for complete search history.

(56) References Cited

U.S. PATENT DOCUMENTS

2012/0280739 A1* 11/2012 Foley ............................ 327/333

* cited by examiner

*Primary Examiner* — Daniel Rojas

(57) ABSTRACT

The voltage level shifter includes a first voltage shift circuit, a second voltage shift circuit, a first switch circuit, a second switch circuit, a third switch circuit and a fourth switch circuit. The first voltage shift circuit receives a first input voltage, and the second voltage shift circuit receives a second voltage shift circuit. When the first voltage is high level voltage, a second output voltage and a first voltage are transformed to a ground voltage so as to open the second switch circuit and the fourth switch circuit, and then the first output voltage is transited to a system voltage. When the second voltage is high level voltage, a first output voltage and a second voltage are transited to a ground voltage so as to open the first switch circuit and the third switch circuit, and then the second output voltage is transited to the system voltage.

10 Claims, 3 Drawing Sheets

VOLTAGE LEVEL SHIFTER

BACKGROUND OF THE DISCLOSURE

1. Field of the Disclosure

The instant disclosure relates to a voltage level shifter; in particular, to a voltage level shifter with 8 transistors (8T).

2. Description of Related Art

Referring to FIG. 1, FIG. 1 shows a circuit diagram of a traditional voltage level shifter in prior art according to an embodiment of the instant disclosure; a traditional voltage level shifter 100 includes N N-type transistor M1 and M2, and P-type transistors M3-M6. A gate of the N-type transistor M1 receives an input voltage IN; a source of the N-type transistor M1 is connected to a ground voltage GND'. A gate of the N-type transistor M2 receives an input voltage INN; a source of the N-type transistor is connected to a ground voltage GND'. A gate of the P-type transistor M3 is connected to a drain of the N-type transistor M2; a drain of the P-type transistor M3 is connected to a drain of the N-type transistor M1 and outputs an output voltage OUTN. A gate of the P-type transistor M4 is connected to a drain of the N-type transistor M1; a drain of the P-type transistor M4 is connected to a drain of the N-type transistor M2 and outputs an output voltage OUT. A gate of the P-type transistor M5 receives a bias voltage VP' to bias voltage at a linear region; a drain of the P-type transistor M5 is connected to a source of the P-type transistor M3, and a source of the P-type transistor M5 is connected to a system voltage VDD'. A gate of the P-type transistor M6 receives the bias voltage VP' to bias voltage at the linear region, and a drain of the P-type transistor M6 is connected to a source of the P-type transistor M4; a source of the P-type transistor M6 is connected to the system voltage VDD'. It is to be clarified that the two input voltages IN and INN are anti-phase.

Regarding the traditional voltage level shifter with a structure of 6 transistors, when the N-type transistor M1 is opened and the N-type transistor M2 is closed, an output voltage OUTN transited to a ground voltage GND' will have the P-type transistor M4 opened to bring an output voltage OUT to the system voltage VDD'. Nevertheless, since only going through or passing the P-type transistor M6 that the output voltage OUT is increased to the system voltage VDD', there could be a problem of a long-time transition.

SUMMARY OF THE DISCLOSURE

The instant disclosure provides a voltage level shifter, the voltage level shifter includes a first voltage shift circuit, a second voltage shift circuit, a first switch circuit, a second switch circuit, a third switch circuit, and a fourth switch circuit. The first voltage shift circuit is connected to a ground voltage, and the first voltage shift circuit receives a first input voltage. The second voltage shift circuit is connected to the ground voltage, and the second voltage shift circuit receives a second input voltage, wherein the first input voltage and the second input voltage are anti-phase. The first switch circuit is connected to the first voltage shift circuit through a first terminal, and outputs a first voltage. The second switch circuit is connected to the second voltage shift circuit through a second terminal, and outputs a second voltage, wherein the second switch circuit is controlled by the second output voltage outputted by the first terminal to determine whether to be open or closed, and the first switch circuit is controlled by the first output voltage outputted by the second terminal to determine whether to be open or closed. The third switch circuit is connected between the system voltage and the first switch circuit, and controlled by the second voltage to determine whether to be open or closed. The fourth switch circuit is connected between the system voltage and the second switch circuit, and controlled by the first voltage to determine whether to be open or closed. When the first input voltage is at high voltage level, the second output voltage and the first voltage will be transited to the ground voltage to open the second switch circuit and the fourth switch circuit, and the first output voltage is accordingly transited into the system voltage. When the second input voltage is at high voltage level, the first output voltage and the second voltage will be transited into the ground voltage to open the first switch circuit and the third switch circuit, and the second output voltage is accordingly transited into the system voltage.

To sum up, during a transition of a voltage level, the voltage level shifter in the embodiment of the instant disclosure will soon increase the second output voltage or the first output voltage to the level of the system voltage through opening the third switch circuit or the fourth switch circuit accordingly.

For further understanding of the instant disclosure, reference is made to the following detailed description illustrating the embodiments and examples of the instant disclosure. The description is only for illustrating the instant disclosure, not for limiting the scope of the claim.

DETAILED DESCRIPTION OF PREFERRED EMBODIMENTS

Figure 1:
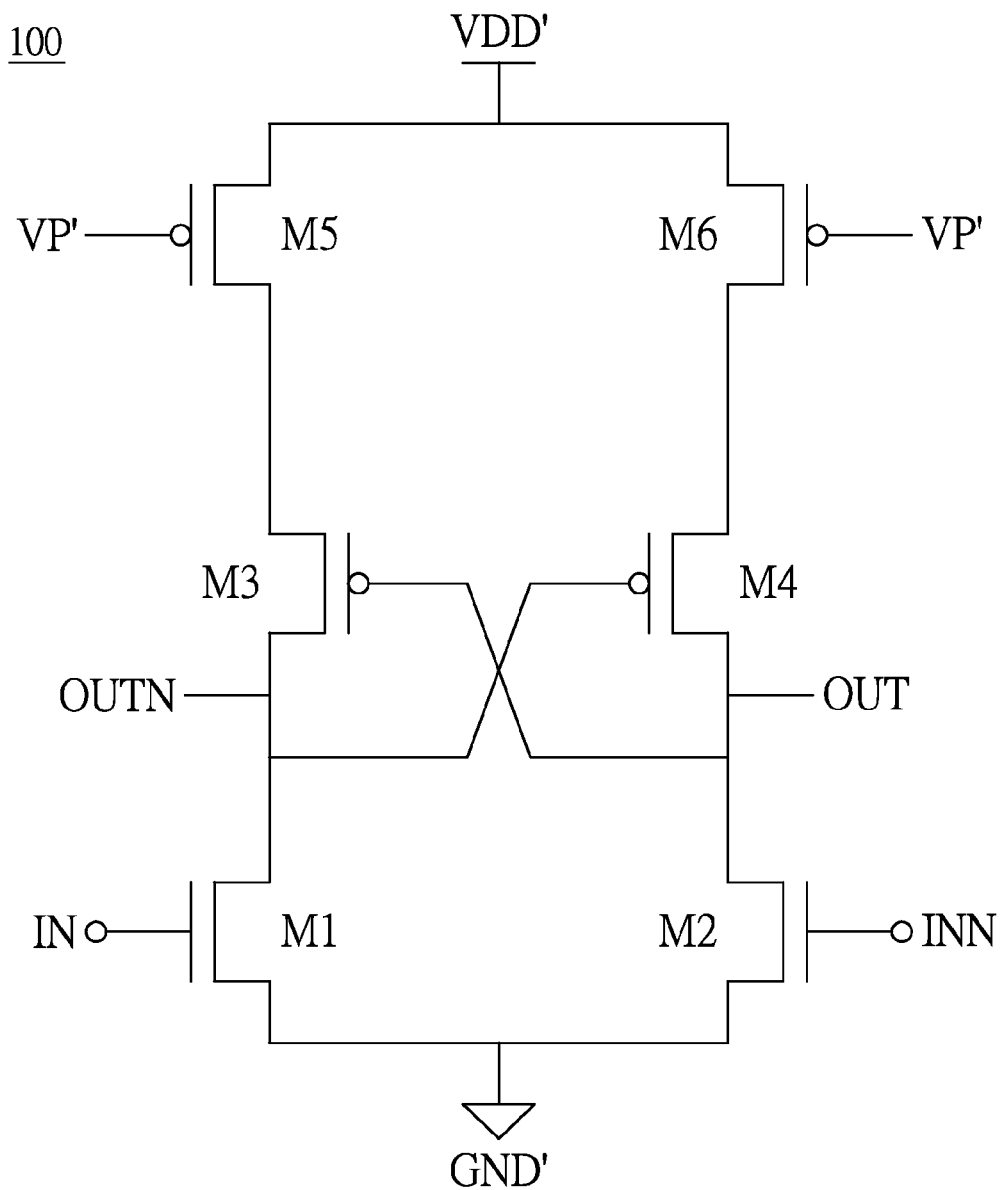
FIG. 1 shows a circuit diagram of a traditional voltage level shifter in prior art according to an embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

Although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

Figure 2:
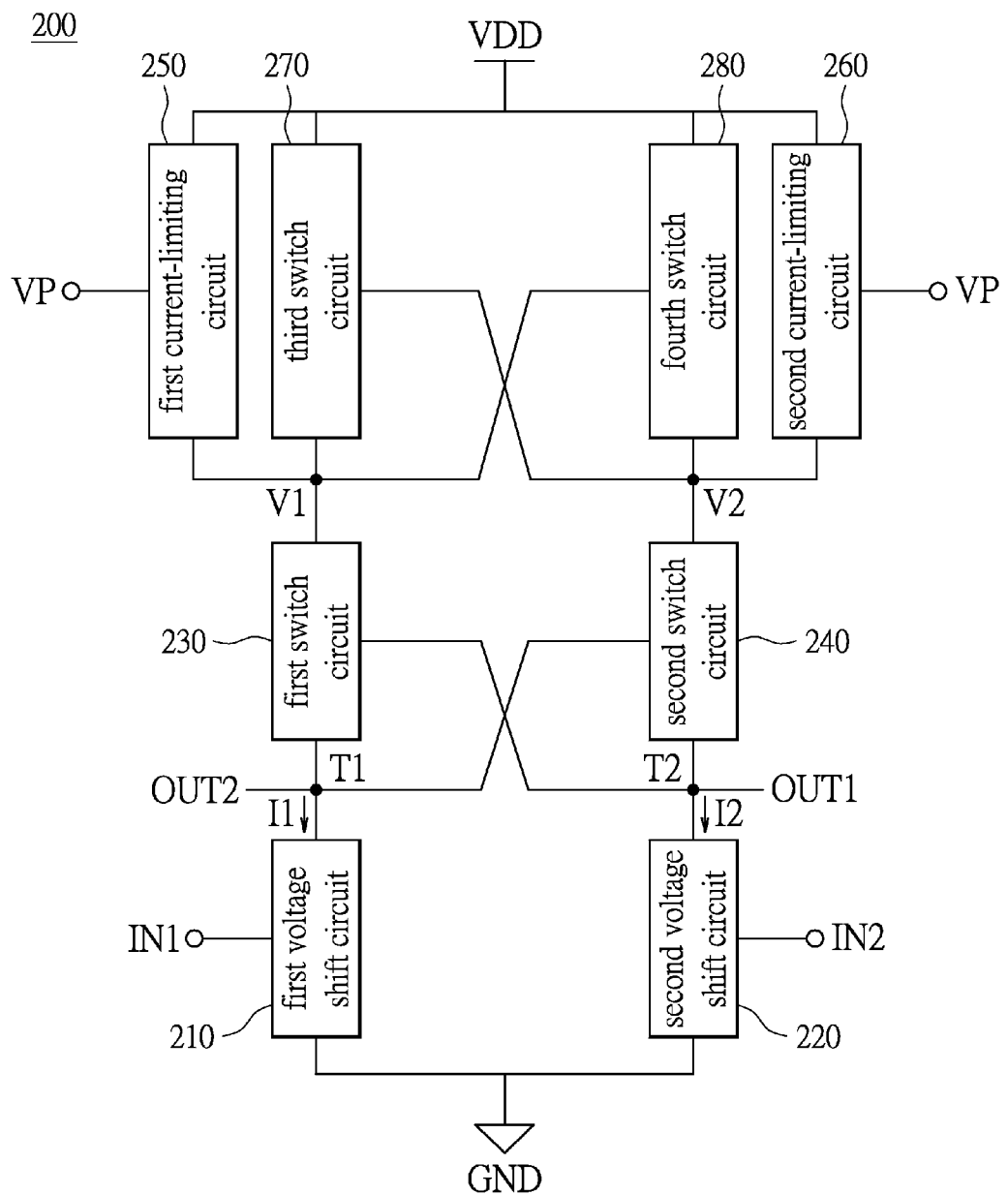
FIG. 2 shows a block diagram of a voltage level shifter according to an embodiment of the instant disclosure.

Referring to FIG. 2, FIG. 2 shows a block diagram of a voltage level shifter according to an embodiment of the instant disclosure. As shown in FIG. 2, the voltage level shifter 200 includes a first voltage shift circuit 210, a second voltage shift circuit 220, a first switch circuit 230, a second switch circuit 240, a first current-limiting circuit 250, a second current-limiting circuit 260, a third switch circuit 270, and a fourth switch circuit 280. The switch circuit may be any type of switch circuit, the type of a switch circuit does not limit the instant disclosure; in an embodiment, a current-limiting circuit 250 or 260 may be a current-limiting resistor or any other circuit element or circuit block. The first switch circuit 230, the second switch circuit 240, the third switch circuit 270, and the fourth switch circuit 280 are low-active circuits.

The first voltage shift circuit 210 is connected to a ground voltage GND; the first voltage shift circuit 210 receives a first input voltage IN1. The second voltage shift circuit 220 is connected to the ground voltage GND; the second voltage shift circuit 220 receives a second input voltage IN2, wherein the first input voltage IN1 and the second input voltage IN2 are anti-phase. The first switch circuit 230 is connected to the first voltage shift circuit 210 through a first terminal T1, and outputs a first voltage V1. The second switch circuit 240 is connected to the second voltage shift circuit 220 through a second terminal T2 and outputs a second voltage V2, wherein the second switch circuit 240 is controlled by a second output voltage OUT2 outputted by the first terminal T1 to determine whether to be open or closed, and the first switch circuit 230 is controlled by a first output voltage OUT1 outputted by the second terminal T2 to determine whether to be open or closed. The first current-limiting circuit 250 is connected between a system voltage VDD and the first switch circuit 230, and the first current-limiting circuit 250 receives a reference voltage VP to limit a first current I1, and further to avoid the first voltage shift circuit 210 being closed because of an over ground bounce of the ground voltage GND. The second current-limiting circuit 260 is connected between the system voltage VDD and the second switch circuit 240, and the second current-limiting circuit 260 receives the reference voltage VP to limit a second current I2, and further to avoid the second voltage shift circuit 220 being closed because of an over ground bounce effect of the ground voltage GND.

The third switch circuit 270 is connected between the system voltage VDD and the first switch circuit 230; furthermore, the first current-limiting circuit 250 and the third switch circuit 270 are both connected between the system voltage VDD and first voltage V1. In the present embodiment, the third switch circuit 270 receives the second voltage V2 and is controlled by the second voltage V2 to determine whether to be open or closed. The fourth switch circuit 280 is connected between the system voltage VDD and the second switch circuit 240; furthermore, the second current-limiting circuit 260 and the fourth switch circuit 280 are both connected between the system voltage VDD and second voltage V2. In the present embodiment, the fourth switch circuit 280 receives the first voltage V1 and is controlled by the first voltage V1 to determine whether to be open or closed. In the present embodiment, a circuit configuration of the first voltage shift circuit 210, the first switch circuit 230, the third switch circuit 270, and the first current-limiting circuit 250 are symmetric to the circuit configuration of the second voltage shift circuit 220, the second switch circuit 240, the fourth switch circuit 280, and the second current-limiting circuit 260, and after a voltage level shift on the first input voltage IN1 and the second input voltage IN2 respectively, the first output voltage OUT1 and the second output voltage OUT2 are transmitted to a next-stage circuit block (not shown in FIG. 2) in turns.

Referring to FIG. 2, in a voltage level shifting duration, when the first input voltage IN1 is at high voltage level and the second input voltage IN2 is at low voltage level, the first voltage shift circuit 210 will be opened (the second voltage shift circuit 220 will be closed) so that the second output voltage OUT2 and the first voltage V1_of the first terminal T1 are transited to the ground voltage GND, and accordingly the second switch circuit 240 and the fourth switch circuit 280 are opened, and the first output voltage OUT1 of the second terminal T2 is further transited to the system voltage VDD. For the time being, given in the former voltage level shifting duration (the first input voltage IN1 is at low voltage level and the second input voltage IN2 is at high voltage level), the first output voltage OUT1 is at low voltage level, and thus at the beginning of the current voltage level shifting duration, the first switch circuit 230 controlled by the first output voltage OUT1 will be opened so that the first voltage V1 will be transited to the ground voltage GND along with the second output voltage OUT2, and then the fourth switch circuit 280 is opened to instantly force the first output voltage OUT1 at the second terminal T2 to be increased to the voltage level of the system voltage VDD. When the first output voltage OUT1 is transited to the system voltage VDD, the first switch circuit 230 controlled by the first output voltage OUT1 will be closed and the first voltage V1 will be increased to close the fourth switch circuit 280; when the second voltage V2 increases to the system voltage VDD, the second current-limiting circuit 260 will be closed. In the beginning of the voltage level shifting duration, the first current-limiting circuit 250 controlled by the reference voltage VP will limit the amount of the first current I1 to avoid the first current I1 from being over to lead to a ground bounce effect.

On the other hand, in a next voltage level shifting duration, when the first input voltage IN1 is at low voltage level and the second input voltage IN2 is at high voltage level, the second voltage shift circuit 220 will be opened (the first voltage shift circuit 210 will be closed), and thus the first output voltage OUT1 and the second voltage V2 at the second terminal T2 are transited to the ground voltage GND, and accordingly the first switch circuit 230 and the third switch circuit 270 are opened, and the second output voltage OUT2 at the first terminal T1 is transited to the system voltage VDD. The rest of work mechanism is similar as the descriptions above, and thus it is not repeated thereto.

Figure 3:
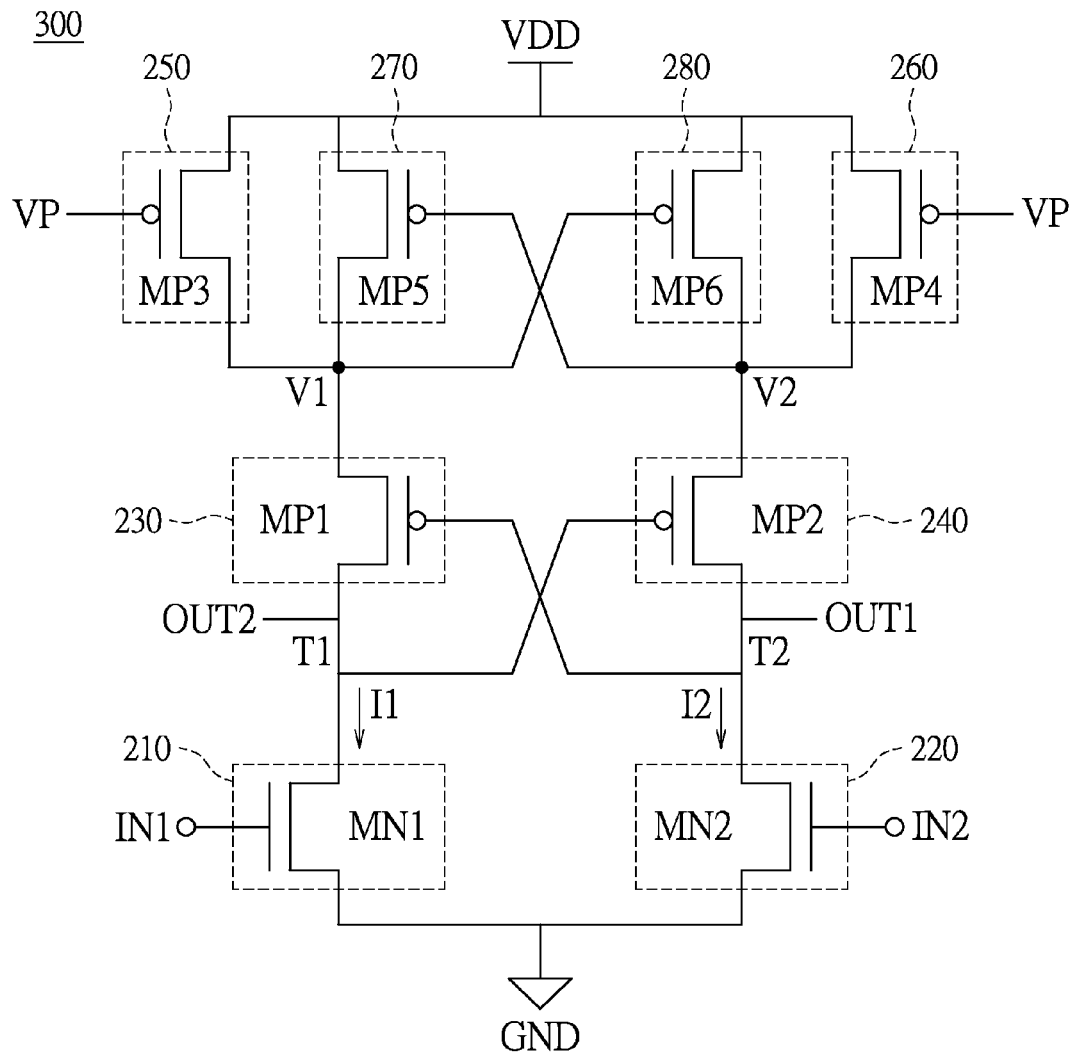
FIG. 3 shows a detailed circuit diagram of a voltage level shifter according to an embodiment of the instant disclosure.

Referring to FIG. 3, FIG. 3 shows a detailed circuit diagram of a voltage level shifter according to an embodiment of the instant disclosure. As shown in FIG. 3, different from the embodiment in FIG. 2, in the present embodiment, a first voltage shift circuit 210 includes a first N-type transistor MN1; a second voltage shift circuit 220 includes a second N-type transistor MN2; a first switch circuit 230 includes a first P-type transistor MP1; a second switch circuit 240 includes a second P-type transistor MP2; a first current-limiting circuit 250 includes a third P-type transistor MP3; a second current-limiting circuit 260 includes a fourth P-type transistor MP4; a third switch circuit 270 includes a fifth P-type transistor MP5, and a fourth switch circuit 280 includes a sixth P-type transistor MP6.

A gate of the first N-type transistor MN1 receives a first input voltage IN1, and a source and a drain of the first N-type transistor MN1 are connected to a ground voltage GND and a first terminal T1 respectively so as to output a second output voltage OUT2. A gate of the second N-type transistor MN2 receives a second input voltage IN2, and a source and a drain of the second N-type transistor MN2 are connected to the ground voltage GND and a second terminal T2 respectively so as to output a first output voltage OUT1. A gate of the first P-type transistor MP1 receives a first output voltage OUIT1 to determine whether to be open or closed, and a drain and a source of the first P-type transistor MP1 are connected to the second output voltage OUT2 and a first voltage V1 respectively. A gate of the second P-type transistor MP2 receives the second output voltage OUT2 so as to determine whether to be open or closed, and a drain and a source of the second P-type transistor MP2 are connected to a first output voltage OUT1 and a second voltage V2 respectively. A gate of the third P-type transistor MP3 receives a reference voltage VP and biases voltage at linear region, and a drain of the third P-type transistor MP3 is connected to the first voltage V1, and a source of the third P-type transistor MP3 is connected to a system voltage VDD, wherein the third P-type transistor MP3 which biases voltage at the linear region may serve as current-limiting resistor of an active element. A gate of the P-type transistor MP4 receives a reference voltage VP to bias voltage at the linear region, and a drain and a source of the fourth P-type transistor MP4 are connected to the second voltage V2 and the system voltage VDD respectively, wherein the fourth P-type transistor MP4 which biases voltage at the linear region may serve as the current-limiting resistor of the active element. A gate of the fifth P-type transistor MP5 receives the second voltage V2 to determine whether to be open or closed, and a drain and a source of the fifth P-type transistor MP5 are connected to the first voltage V1 and the system voltage VDD respectively. A gate of the sixth P-type transistor MP6 receives the first voltage V1 so as to determine whether to be open or closed, and a drain and a source of the sixth P-type transistor MP6 are connected to the second voltage V2 and the system voltage VDD respectively.

Referring to FIG. 3 as well, in the voltage level shifting duration, when the first N-type transistor MN1 receives the first input voltage IN1 of high level voltage and the second N-type transistor MN2 receives the second input voltage IN2 of low voltage level, the first N-type transistor MN1 will be opened (the second N-type transistor MN2 will be closed) so that the second output voltage OUT2 and the first voltage V1 at the first terminal T1 are transited to the ground voltage GND, and accordingly the second P-type transistor MP2 and the sixth P-type transistor MP6 are open, and the first output voltage OUT1 at the second terminal T2 will soon be transited to the system voltage VDD. For the time being, given in the former voltage level shifting duration (i.e. when the first N-type transistor MN1 receives the first input voltage IN1 at low voltage level and the second N-type transistor MN2 receives the second input voltage IN2 at high voltage level), the first output voltage OUT1 is at low voltage level; therefore, in the beginning of the current voltage level shifting duration, the first P-type transistor MP1 controlled by the first output voltage OUT1 is opened so that the first voltage V1 will be transited to the ground voltage GND along with the second output voltage OUT2, and the sixth P-type transistor MP6 is opened to force the first output voltage OUT1 at the second terminal T2 to the voltage level of the system voltage VDD and a quick transition is achieved. When the first output voltage OUT1 is transited to the system voltage VDD, the first P-type transistor MP1 controlled by the first output voltage OUT1 will be closed and the first voltage V1 will increase to close the sixth P-type transistor MP6; when the second voltage V2 increases to the system voltage VDD, the fourth P-type transistor MP4 serving as the current-limiting resistor will be closed.

In the beginning of the voltage level shifting duration, the third P-type transistor MP3 controlled by the reference voltage VP will limit the amount of the first current I1 to avoid the first current I1 from being over and leading to a ground bounce effect. In other words, the user may utilize a design of the reference voltage VP to have the third P-type transistor MP3 limit the amount of the first current I1 so as to avoid the ground voltage GND from being overly high or low. Once the ground voltage GND is overly high or low, the ground bounce effect will reduce a gate-to-source voltage of the first N-type transistor MN1, and the first N-type transistor MN1 would be closed and which leads to an error function of the whole circuit.

On the other hand, in the next voltage level shifting duration, when the first N-type transistor MN1 receives the first input voltage IN1 at low voltage level and the second N-type transistor MN2 receives the second input voltage IN2 of high voltage level, the second N-type transistor MN2 will be opened (the first N-type transistor MN1 will be closed) so that the first output voltage OUT1 and the first voltage V2 at the second terminal T2 are transited to the ground voltage GND, and accordingly the first P-type transistor MP1 and the fifth P-type transistor MP5 are opened, and the second output voltage OUT2 at the first terminal T1 will soon be transited to the system voltage VDD. For the time being, it is worth mentioning that, given in the former voltage level shifting duration (i.e. when the first N-type transistor MN1 receives the first input voltage IN1 at high voltage level and the second N-type transistor MN2 receives the second input voltage IN2 at low voltage level), the second output voltage OUT2 is at low voltage level, and thus in the beginning of the current voltage level shifting duration, the second P-type transistor MP2 controlled by the second output voltage OUT2 is opened so that the second voltage V2 will be transited to the ground voltage GND along with the first output voltage OUT1, and the fifth P-type transistor MP5 is opened so as to force the second output voltage OUT2 at the first terminal T1 to the voltage level of the system voltage VDD and achieve a quick transition. In addition, when the second output voltage OUT2 is transited to the system voltage VDD, the second P-type transistor MP2 controlled by the second output voltage OUT2 will be closed and the second voltage V2 will increase to close the fifth P-type transistor MP5; moreover, when the first voltage V1 increases to the system voltage VDD, the third P-type transistor MP3 serving as the current-limiting resistor will be closed.

In the beginning of the voltage level shifting duration, the fourth P-type transistor MP4 controlled by the reference voltage VP will limit the amount of the second current I2 to avoid the first current I2 from being over and leading to a ground bounce effect. In other words, the user may utilize a design of the reference voltage VP to have the fourth P-type transistor MP4 limit the amount of the second current I2 and to avoid the ground voltage GND from being overly high or low. Once the ground voltage GND is overly high or low, the ground bounce effect will reduce a gate-to-source voltage of the second N-type transistor MN2, and the second N-type transistor MN2 is closed and which leads to an error function of the whole circuit.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A voltage level shifter, comprising:
a first voltage shift circuit, connected to a ground voltage, and the first voltage shift circuit receiving a first input voltage;
a second voltage shift circuit, connected to the ground voltage, and the second voltage shift circuit receiving a second input voltage, wherein the first input voltage and the second input voltage are anti-phase;
a first switch circuit, connected to the first voltage shift circuit through a first terminal, and outputting a first voltage;
a second switch circuit, connected to the second voltage shift circuit through a second terminal, and outputting a second voltage, wherein the second switch circuit is controlled by a second output voltage outputted by the first terminal to determine whether to be open or closed, and the first switch circuit is controlled by a first output voltage outputted by the second terminal to determine whether to be open or closed;

a third switch circuit, connected between a system voltage and the first switch circuit, and controlled by the second voltage to determine whether to be open or closed; and a fourth switch circuit, connected between the system voltage and the second switch circuit, and controlled by the first voltage to determine whether to be open or closed;

a first current-limiting circuit, connected between the system voltage and the first switch circuit, and the first current-limiting circuit receiving a reference voltage to limit a first current; and a second current-limiting circuit, connected between the system voltage and the second switch circuit, and the second current-limiting circuit receiving the reference voltage to limit a second current;

wherein when the first input voltage is at high voltage level, the second output voltage and the first voltage will be transited to the ground voltage so as to open the second switch circuit and the fourth switch circuit, and accordingly the first output voltage is transited into the system voltage, wherein when the second input voltage is at high voltage level, the first output voltage and the second voltage will be transited into the ground voltage so as to open the first switch circuit and the third switch circuit, and accordingly the second output voltage is transited into the system wherein when the first input voltage is at the high voltage level, the second voltage is transited to the system voltage it close the second current-limiting circuit and wherein when the second input voltage is at high voltage level, the first voltage is transited to the system voltage to close the first current-limiting circuit.

2. The voltage level shifter according to claim 1, wherein when the first output voltage is transited to the system voltage, the first switch circuit is closed and the first voltage increases so as to close the fourth switch circuit.

3. The voltage level shifter according to claim 1, wherein when the second output voltage is transited to the system voltage, the second switch circuit is closed and the second voltage increases to close the third switch circuit.

4. The voltage level shifter according to claim 1, further comprising:

a first current-limiting circuit, connected between the system voltage and the first switch circuit, and the first current-limiting circuit receiving a reference voltage to limit a first current; and a second current-limiting circuit, connected between the system voltage and the second switch circuit, and the second current-limiting circuit receiving the reference voltage to limit a second current, wherein when the first input voltage is at high voltage level, the second voltage is transited to the system voltage to close the second current-limiting circuit, wherein when the second input voltage is at high voltage level, the first voltage is transited to the system voltage to close the first current-limiting circuit.

5. The voltage level shifter according to claim 4, wherein the first current and the second current are currents during transition.

6. The voltage level shifter according to claim 1, wherein the first voltage shift circuit comprises a first N-type transistor; the second voltage shift circuit comprises a second N-type transistor; the first switch circuit comprises a first P-type transistor; the second switch circuit comprises a second P-type transistor; the first current-limiting circuit comprises a third P-type transistor; the second current-limiting circuit comprises a fourth P-type transistor; the third switch circuit comprises a fifth P-type transistor, and the fourth switch circuit comprises a sixth P-type transistor.

7. The voltage level shifter according to claim 6, wherein the first N-type transistor has a gate receiving the first input voltage, a source connected to the ground voltage, and a drain connected to the first terminal to output the second output voltage, wherein the second N-type transistor has a gate receiving the second input voltage, a source connected to the ground voltage, and a drain connected to the second terminal to output the first output voltage.

8. The voltage level shifter according to claim 7, wherein the first P-type transistor has a gate receiving the first output voltage to determine to be open or closed, a drain connected to the second output voltage, and a source connected to the first voltage, wherein the second P-type transistor has a gate receiving the second output voltage to determine to be open or closed, a drain connected to the first output voltage, and a source connected to the second voltage, wherein the third P-type transistor has a gate receiving the reference voltage to bias the third P-type transistor at a linear region, a drain connected to the first voltage, and a source connected to the system voltage, wherein the fourth P-type transistor has a gate receiving the reference voltage to bias the fourth P-type transistor at the linear region, a drain connected to the second voltage, and a source connected to the system voltage, wherein the fifth P-type transistor has a gate receiving second voltage to determine to be open or closed, a drain connected to the first voltage, and a source connected to the system voltage, wherein the sixth P-type transistor has a gate receiving the first voltage to determine to be open or closed, a drain connected to the second voltage, and a source connected to the system voltage.

9. The voltage level shifter according to claim 8, wherein when the first input voltage is at high voltage level and the second input voltage is at low voltage level, the second output voltage and the first voltage are transited to the ground voltage to open the second P-type transistor and the sixth P-type transistor, and the second voltage and the first output voltage are accordingly transited to the system voltage; when the second voltage is transited to the system voltage, the fourth P-type transistor is closed; when the first output voltage is transited to the system voltage, the first P-type transistor is closed and the first voltage increases to close the sixth P-type transistor.

10. The voltage level shifter according to claim 8, wherein when the second input voltage is at high voltage level and the first input voltage is at low voltage level, the first output voltage and the second voltage will be transited to the ground voltage to open the first P-type transistor and the fifth P-type transistor, and the first voltage and the second output voltage will be transited to the system voltage; when the first voltage is transited to the system voltage, the third P-type transistor will be closed; when the second output voltage is transited to the system voltage, the second P-type transistor will be closed and the second voltage increases to close the fifth P-type transistor.

* * * * *